(12) United States Patent
Tokura et al.

(10) Patent No.: US 7,084,624 B2
(45) Date of Patent: Aug. 1, 2006

(54) MAGNETIC SENSOR

(75) Inventors: Yoshinori Tokura, Ibaraki (JP);
Masashi Kawasaki, Ibaraki (JP);
Hiroyuki Yamada, Ibaraki (JP);
Yoshihiro Ogawa, Ibaraki (JP); Yoshio Kaneko, Chiba (JP)

(73) Assignees: National Institute of Advanced Industrial Science and Technology, Tokyo (JP); Japan Science and Technology Agency, Kawaguchi (JP)

( * ) Notice: Subject to any disclaimer, the term of this patent is extended or adjusted under 35 U.S.C. 154(b) by 62 days.

(21) Appl. No.: 10/495,127

(22) PCT Filed: Feb. 14, 2003

(86) PCT No.: PCT/JP03/01543

§ 371 (c)(1),
(2), (4) Date: May 20, 2004

(87) PCT Pub. No.: WO2004/019051

PCT Pub. Date: Mar. 4, 2004

(65) Prior Publication Data
US 2005/0012937 A1    Jan. 20, 2005

(30) Foreign Application Priority Data
Aug. 23, 2002  (JP) ............................. 2002-243942

(51) Int. Cl.
*G01R 33/02* (2006.01)
(52) U.S. Cl. .................................. 324/244.1; 324/244
(58) Field of Classification Search ............. 324/244.1, 324/244
See application file for complete search history.

(56) References Cited

U.S. PATENT DOCUMENTS

| 4,516,073 A | * | 5/1985 | Doriath et al. ........... 324/244.1 |
| 5,038,103 A | * | 8/1991 | Scarzello et al. ........ 324/244.1 |
| 6,515,745 B1 | * | 2/2003 | Vurens et al. ............. 356/369 |

FOREIGN PATENT DOCUMENTS

WO    85/01144    3/1985

OTHER PUBLICATIONS

Bert Koopmans et al., Observation of Large Kerr Angles in the Nonlinear Optical Response from Magneitc Multilayers. Physical Review Letters, May 1, 1995, vol. 74, No. 18, pp. 3692-3695.

* cited by examiner

*Primary Examiner*—Reena Aurora
(74) *Attorney, Agent, or Firm*—Oblon, Spivak, McClelland, Maier & Neustadt, P.C.

(57) ABSTRACT

The present invention provides a magnetic sensor capable of reproducing a magnetic record even if the size of a recorded magnetization is a minute one, directly reading a magnetization recorded on a magneto-optical disk without applying incident light itself to the magneto-optical disk, and obtaining signals of a second harmonic having a high S/N ratio. This magnetic sensor includes a magnetic sensor element (102) having electric polarization disposed with respect to a perpendicular recording medium (101), and laser generating means acting on the magnetic sensor element (102). The magnetic sensor reads information in the perpendicular recording medium (101) based on the variation of the rotation angle $\phi$ of the polarization plane of a second harmonic (105) of a frequency $2\omega$ exiting the magnetic sensor element (102) by the application of laser light (104) with a frequency $\omega$ from the laser generation means to the magnetic sensor element (102).

19 Claims, 8 Drawing Sheets

PRIOR ART

MAGNETIC SENSOR

TECHNICAL FIELD

The present invention relates to a magnetic sensor. More specifically, the present invention pertains to a magnetic sensor element using a second harmonic, and allowing spin information imbedded within a solid, such as a magneto-optical disk or hard disk device (HDD), to be read out (reproduced) with high sensitivity and high spatial resolution.

BACKGROUND ART

For the reproduction of information recorded on a magneto-optical disk, the Kerr effect of reflected light, which is a magneto-optical effect, is conventionally utilized.

FIG. 1 is a diagram explaining the reproduction principle of such a conventional magneto-optical disk.

In FIG. 1, reference numeral 1 denotes a semiconductor laser, numerals 2, 4, and 5 denote lenses, numeral 3 denotes a polarizer, numeral 6 denotes an analyzer, numeral 7 denotes a photodiode, numeral 8 denotes incident light, numeral 9 denotes reflected light, and numeral 10 denotes a perpendicular magnetic recording film.

As shown in FIG. 1, in the reproduction principle of a magneto-optical disk, the polarization plane of the reflected light 9 rotates with respect to that of the incident light 8 under the Kerr effect. The rotation angle of the polarization plane of the reflected light 9 is read and thereby storage is reproduced. Here, the rotation angle exhibits a maximum value when the direction of magnetization and the traveling direction of light are parallel to each other. For a recording film, therefore, a material having a magnetization perpendicular to the surface of a memory medium is desirable. The conditions of having a magnetization perpendicular to the surface in this way, offers the advantages of increasing the surface density and allowing the achievement of high density recording. Therefore, the perpendicular magnetic recording system will become mainstream henceforward.

The memory capacity of a magneto-optical disk depends on the spot size of a semiconductor laser used for reproduction. The typical reproduction wavelength of the semiconductor laser is in the range of 0.78 to 0.65 μm. In terms of reading accuracy, the size of magnetization is limited to the order of reading wavelength. This results in the limitation of recording capacity, thus constituting the largest problem to be solved henceforth.

On the other hand, an invention such as a magnetically induced super resolution (MSR) system is disclosed. Use of this system is making it possible to read out even a magnetization size of about a half of the typical reproduction wavelength of a semiconductor laser. According to K. Shono [J. Magn. Soc. Jpn. 19, Supple, S1 (1999) 177], a recording mark of 0.3 μm was reproduced at a wavelength of a red laser, and a recording capacity of 1.3 GB was implemented with a MO disk of 3.5 inch. However, this is also a reading size of about a half of the wavelength at most, and therefore, it is difficult to reproduce a minute magnetization size of not more than 0.1 μm (1000 Å). Hence, this system has also its limit in recording capacity as a natural result, thus constituting a serious problem to be solved, as well.

According to conventional methods in which the magneto-optical effect is utilized for the reproduction of information, semiconductor laser light is directly made incident onto a magneto-optical disk on which records are written. When the temperature increased by this incident light has reached a temperature of not less than the spin alignment temperature (Curie temperature Tc) of the magnetic material of the magneto-optical disk, the storage is unfavorably erased. Accordingly, a problem occurs in that the intensity of the incident light for reading must be limited so that this transition temperature Tc or more is not reached. This results in imposing restrictions on the S/N ratio improvement of reproduction signals, thereby causing an excessively high load on a reproduction signal processing system.

While the foregoing concerns problems associated with the reproduction of recording data on the magneto-optical disk, the reproduction device using a magnetoresistive mechanism of a hard disk device (HDD) has also similar technical problems. With the trend moving toward increasingly minuter configurations of magnetic materials for recording, it is necessary for the reproduction to read magnetism in ultrafine areas with high sensitivity.

As a next generation technology for reading HDD data, a tunneling magneto resistive (TMR) head (Fujikata et al., The 8th Joint MMM-Intermag Conference Abstracts, p. 492, January 2001), and as a technology of the generation after the next generation, an extraordinary magneto resistive (EMR) head are being developed in a fierce competition among manufacturers.

Even in this EMR, which is referred to as a technology of the generation after the next generation, at the stage of prototyping stage, the diameter of a reading element is several millimeters (Solin et al., Science, vol. 289, pp. 1530–1532, September 2000), and the reading of a magnetization size of not more than 0.1 μm (1000 Å) will be a challenge for the future. The commercialization of EMR, therefore, will be a long way into the future.

DISCLOSURE OF INVENTION

Due to bloated information industries and storages of image information and the like, demands for the increase in storage capacity seems boundless. Therefore, with respect to the miniaturization trend in memory size, further demands for its continuing miniaturization is being made. In 2004, in order to implement a memory capacity of 100 Gbpsi, the size of magnetic material is miniaturized down to a size on the order of 30 nm (300 Å). In 2007, in order to realize a memory capacity of 1000 Gbpsi, the size of magnetic material is forecast to be miniaturized down to a size on the order of 10 nm (100 Å).

Accordingly, a first object of the present invention is to make it possible to reproduce a magnetic record even if the size of a recorded magnetization is a minute one, such as a size of several hundred or several ten Angstroms, or a lattice size of several Angstroms. This will drastically increase the memory capacity of a magneto-optical disk or HDD. This method is principally different from that of the conventional Kerr rotation mechanism or magnetoresistive mechanism. This method provides a magnetic sensor that utilizes the rotation of the polarization plane of a second harmonic of the reflected light with respect to incident light, based on the nonlinear optical response theory associated with the asymmetry of a magnetic material.

A second object of the present invention is to provide a magnetic sensor that does not impose limitations on the incident light intensity, that is, a magnetic sensor that allows a magnetization recorded on a magneto-optical disk to be directly read without applying incident light itself to the magneto-optical disk. This is for circumventing the risk of unnecessarily raising the temperature of the recording medium during reproduction to such an extent that the recording medium is heated up to a higher temperature than the transition temperature of magnetization.

According to the magnetic sensor of the present invention, it is possible to detect a magnetic field from the magneto-optical disk by applying semiconductor laser light to the magnetic sensor element and detecting a second harmonic, which is an output from the element. In this case, therefore, unlike the case where the conventional Kerr effect is utilized as a reproduction method, information written on the magneto-optical disk can be reproduced without directly applying light to the magneto-optical disk.

A third object of the present invention is to provide a magnetic sensor that, when a semiconductor laser light for generating a second harmonic is applied to a magnetic sensor element for reading a magnetization recorded on the magneto-optical disk, can obtain reproduction signals having a sufficiently high S/N ratio even if the incident light intensity is low. According to this magnetic sensor, the rotation angle of polarization plane obtained by the magnetic sensor element is a gigantic polarization rotation angle (several degrees to several ten degrees), which is about several tens to about several hundred times as large as the conventional rotation angle of polarization plane obtained under the Kerr effect. This allows the present magnetic sensor to achieve a high S/N ratio. In this connection, the rotational degree of polarization plane according to the conventional Kerr rotational method is 0.3° (Tc=130° C.) for TbFe, and 0.35° (Tc=220° C.) for GdFe.

The wavelength of a second harmonic is one half as long as an incident wavelength. Use of a wavelength filter would allow reflected wave components having the same wavelength as that of the incident wave to be easily removed, so that signals of the second harmonic with a high S/N ratio could be obtained. This also offers an advantage over the case where the conventional Kerr rotation is used.

As described above, the present invention aims to provide a magnetic sensor capable of reproducing a magnetic record even if the size of a recorded magnetization is a minute one, directly reading a magnetization recorded on a magneto-optical disk without applying incident light itself to the magneto-optical disk, and obtaining signals of a second harmonic having a high S/N ratio.

In order to achieve the above-described objects:

[1] the present invention provides a magnetic sensor including a magnetic sensor element that is disposed with respect to a body having spin information, that has an interface structure having spatial asymmetry, and in which one solid material constituting the interface is a magnetic material; and laser beam irradiation means acting on the magnetic sensor element. This magnetic sensor reads out the spin information of the body having the spin information based on the variation of the rotation angle of the polarization plane of a second harmonic with a frequency 2ω exiting the magnetic sensor element, by applying laser light with a frequency ω to the magnetic sensor element by the laser beam irradiation means.

[2] in the magnetic sensor set forth in the above-described [1], in order to generate the second harmonic, at least one magnetic material of the magnetic sensor element comprises a structure in which the interface is constituted of a ferromagnetic material (including a ferrimagnetic material).

[3] in the magnetic sensor set forth in the above-described [2], in order to generate the second harmonic, at least one material of the magnetic sensor element is a ferromagnetic (including ferrimagnetic) thin film material, and the other materials are multilayered thin film materials that constitute interfaces using a plurality of thin film materials.

[4] in the magnetic sensor set forth in the above-described [3], out of the plurality of thin film materials, at least one is a transition metal film or a transition metal oxide film.

[5] in the magnetic sensor set forth in the above-described [4], out of the plurality of thin film materials, at least one is a manganese oxide compound film.

[6] in the magnetic sensor set forth in the above-described [5], out of the plurality of thin film materials, at least one is $(A_{1-x}B_x)$ $MnO_3$ ($0 \leq x \leq 1$), wherein A is an alkaline-earth element such as Ca, Sr or Ba, or a rare-earth element such as La, or a Y or Bi element, and wherein B is an alkaline-earth element such as Ca, Sr or Ba, or a rare-earth element such as La, both exclusive of A, or an oxide comprising Y or Bi.

[7] in the magnetic sensor set forth in the above-described [6], out of the plurality of kinds of thin film materials, at least one kind of thin film material is $(A_{1-x}B_x)$ $MnO_3$ ($0 \leq x \leq 1$), and with a film construction comprising the other plural kinds of films treated as one unit, a multilayer film formed by repeating the unit a plurality of times is used as at least one thin film material.

[8] in the magnetic sensor set forth in the above-described [1], in order to generate the second harmonic, at least one thin film or crystal flake of the magnetic sensor element comprises a material having an easy magnetization axis and a polarization axis that are perpendicular to each other.

[9] in the magnetic sensor set forth in the above-described [8], in order to generate the second harmonic, one thin film material and other plural thin film materials of the magnetic sensor element are used, the one thin film material and the other plural thin film materials each having the easy magnetization axis and the polarization axis that are mutually perpendicular.

[10] in the magnetic sensor set forth in the above-described [9], in order to generate the second harmonic, light having an electric field component perpendicular to the easy magnetization axis is made incident on a material of the magnetic sensor element which material has the easy magnetization axis and the polarization axis that are perpendicular to each other, and the second harmonic component of the light is used that reflects with respect to the incident light or that is transmitted.

[11] in the magnetic sensor set forth in the above-described [10], out of the plurality of thin film materials of the magnetic sensor element, at least one is a transition metal film or a transition metal oxide film.

[12] in the magnetic sensor set forth in the above-described [11], out of the plurality of thin film materials of the magnetic sensor element, at least one is a manganese oxide compound film.

[13] in the magnetic sensor set forth in the above-described [12], out of the plurality of thin film materials of the magnetic sensor element, at least one is $(A_{1-x}B_x)$ $MnO_3$ ($0 \leq x \leq 1$), wherein A is an alkaline-earth element such as Ca, Sr or Ba, or a rare-earth element such as La, or a Y or Bi element, and wherein B is an alkaline-earth element such as Ca, Sr or Ba, or a rare-earth element such as La, both exclusive of A, or an oxide comprising Y or Bi.

[14] in the magnetic sensor set forth in the above-described [13], out of the plurality of kinds of thin film materials of the magnetic sensor element, at least one kind of film of the magnetic sensor element is $(A_{1-x}B_x)$ $MnO_3$ ($0 \leq x \leq 1$), and with a film construction comprising the other plural kinds of films treated as one unit, a multilayer film formed by repeating the unit a plurality of times is used as at least one thin film material.

[15] in the magnetic sensor set forth in the above-described [10], [11], or [12], an iron oxide and an iron oxide thin film are used as materials of the magnetic sensor element, the materials each having the easy magnetization axis and the polarization axis that are mutually perpendicular.

[16] in the magnetic sensor set forth in the above-described [15], a crystal and a thin film of $Ga_{2-x}Fe_xO_3$ are used, as materials of the magnetic sensor element, the materials each having the easy magnetization axis and the polarization axis that are mutually perpendicular.

[17] in the magnetic sensor set forth in the above-described [16], a crystal and a thin film of $Ga_{2-x}Fe_xO_3$ is used that has a rhombic crystal structure and in which x defining the composition of iron is in the range of 0.7 to 1.5, both inclusive, as materials of the magnetic sensor element each having the easy magnetization axis and the polarization axis that are mutually perpendicular.

[18] in the magnetic sensor set forth in any one of the above-described [2] to [17], a multilayer structure is used that is formed by sandwiching the transition metal oxide thin film of the magnetic sensor element between $SrTiO_3$ thin films above and below.

[19] in the magnetic sensor set forth in any one of the above-described [2] to [17], a $SrTiO_3$ crystal is used as a material of a substrate for supporting a plurality of thin film materials of the magnetic sensor element.

In this invention, on the implementation of a magnetic sensor as a record reproducing element indispensable for realizing an enormous magneto-optical disk and HDD in a region of several terabits (Tb) psi (per square inch), the present inventors have invented a magnetic sensor using a second harmonic in order to solve the magnetic sensor problem that, in the conventional art, when a magnetic domain structure as a minimum unit in which information is stored has a size of not more than about 1000 Å, the reproduction of the record would become difficult.

The minimum constituent requirement of this magnetic sensor is that at least one magnetic material thereof is a ferromagnetic material [including a ferrimagnetic material].

Materials other than one ferromagnetic material are not limited to solids, but may be gases. With an interface constituted of two kinds of materials being definable, the polarization plane of a second harmonic of the reflected light (transmitting light) with respect to incident light rotates with respect to the polarization plane of the incident light, and a similar effect is produced in a magnetic sensor comprising several kinds of thin films. This magnetic material may be either a transition metal, or a transition metal oxide. Alternatively, the magnetic material may be one of Mn oxide compounds showing various kinds of magnetisms.

As shown in an embodiment, the magnetic material may be $(A_{1-x}B_x) MnO_3$ ($0.1 \leq x \leq 1$), wherein A is an alkaline-earth element such as Ca, Sr or Ba, or a rare-earth element such as La, or a Y or Bi element, and wherein B is an alkaline-earth element such as Ca, Sr or Ba, or a rare-earth element such as La, both exclusive of A, or an oxide comprising a Y or Bi element.

When a second harmonic is used for a magnetic sensor, a similar effect is produced even in a material having an easy magnetization axis and a polarization axis of magnetization that are perpendicular to each other. The geometrical arrangement of this magnetic sensor is set forth in the present invention. Magnetic (thin films) materials having polarization and capable of constituting a magnetic sensor utilizing a second harmonic are set forth in the present invention. A material serving as such a multilayered protective film or substrate is set forth in the present invention. Their matrix is specified as an appropriate material that is low in misfit in lattice constants between intended thin film materials and the matrix.

[Operation]

According to the present invention, it is possible to provide a magnetic sensor capable of reading out spin information imbedded within a solid. This makes it possible to provide an element capable of reproducing even a minute storage area of less than 1000 Å, such as several hundred angstroms or several angstroms as an reproduction element of a magneto-optical disk. This element can also be put into practical use as a reading device for a hard disk device (HDD). Use of this reproduction element allows the storage capacity to be raised up to a region of 1000 Gbpsi in a stroke.

BEST MODE FOR CARRYING OUT THE INVENTION

Hereinafter, embodiments according to the present invention will be described with reference to the drawings.

Figure 2:
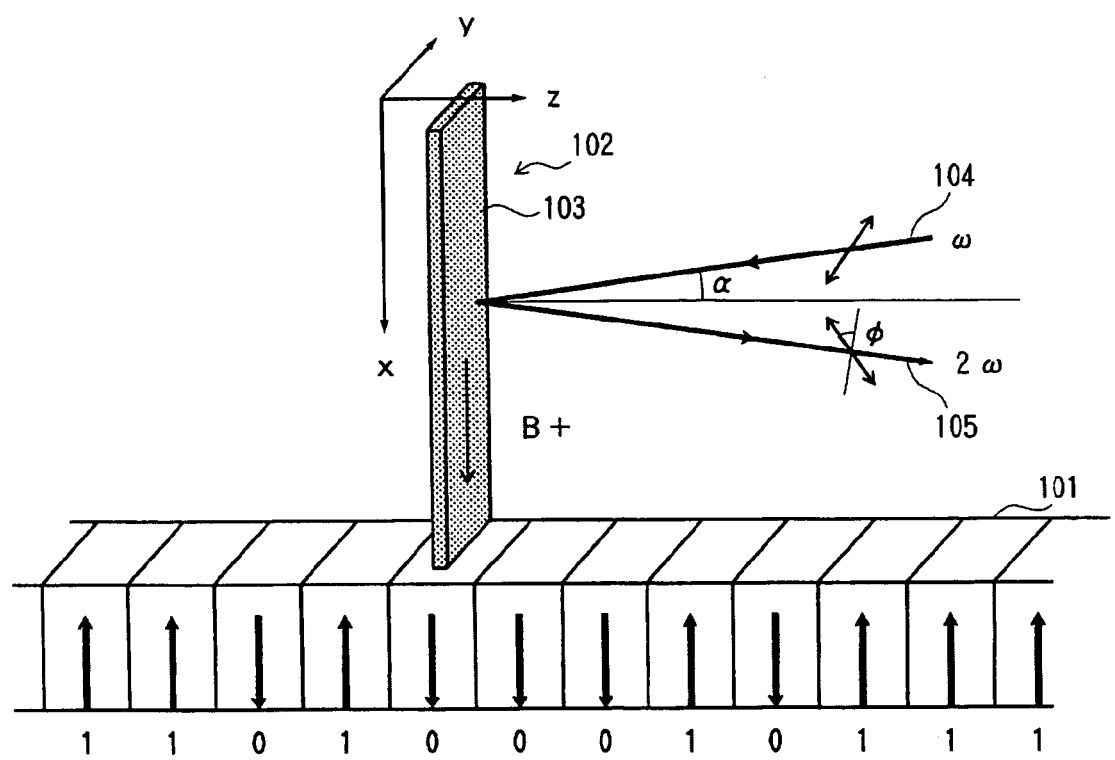
FIG. 2 is a principle view of a magnetic sensor using a second harmonic according to the present invention.

FIG. 2 is a principle view of a magnetic sensor using a second harmonic according to the present invention.

In FIG. 2, reference numeral 101 denotes a perpendicular magnetic recording film (an object having spin information, i.e., a recording medium), numeral 102 denotes a sensor element, numeral 103 denotes a magnetic material, numeral 104 denotes laser light with a frequency $\omega$, and numeral 105 denotes a second harmonic with a frequency $2\omega$.

Suppose the laser light 104 is made incident on the sensor element 102 at an incident angle $\alpha$. Here, the material constituting the sensor element 102 is assumed to be the magnetic material 103. When the magnetic material 103 feels a positive or negative magnetic field (magnetic flux density=B) generated by downward magnetization (data: 0) or upward magnetization (data: 1) of the perpendicular magnetic recording film 101, the direction of the spin of a magnetic domain becomes the downward direction (x-direction for the ferromagnetic material 103) or the upward direction. The magnetic material 103 generates the second harmonic 105 with a frequency 2ω, and the polarization plane of the second harmonic 105 rotates by a degree of +φ or −φ. An observation of the polarization plane allows the direction of spin of the perpendicular magnetic recording film 101 to be detectable. The magnetic material 103, therefore, performs the function of the magnetic sensor element 102.

Pustogowa [Phys. Rev. B49 (1994) 10031] et al. theoretically predicted, using an iron metal thin film, that the polarization plane of a second harmonic from the interface of a magnetic material rotates, and Rasing [Phys. Rev. Lett. 74 (1995) 3692, J. Appl. Phys. 79 (1996) 6181] et al observed the rotation of the polarization plane of a second harmonic, on a Fe/Cr film formed of a sputter film.

The rotation angle then was 34°, which is orders of magnitude larger than the conventional Kerr's rotational angle (0.03°). This principle makes use of the generation of a second harmonic as a result of introducing an asymmetry of a material due to the formation of an interface.

The present invention constructed a magnetic sensor with attention focused to the above-described principle. Specifically, because of its sensitiveness to an interface, this principle could be utilized for a monitor for spin states. Furthermore, by taking advantage of the fact that the direction of spin reacts to a magnetic field generated by a magnetization constituting a memory, the present invention has succeeded in incorporating this principle in a magnetic sensor.

In essence, the magnetic sensor using a second harmonic has only to be formed into a structure having an asymmetry. Therefore, in principle, it is essential only that an interface with a size of several angstroms can be formed. This is because the interface with a size of several angstroms becomes a limiting factor in the spatial resolution of the magnetic sensor, thereby allowing a magnetization in a several angstrom region to be read. Although, in actuality, depending on the flatness of an interface and on the film thickness of a thin film as shown in embodiments, the spatial resolution of the magnetic sensor enables data reading up to just the ultimate minute region.

Moreover, in the present invention, it is demonstrated that the above-described effect is enhanced when a material constituting such an element has electric polarization P. In FIG. 2, with the polarization P faced in a z-axis, and with the direction of magnetization being x-axis direction, when the electric field vector E of incident light has a y-direction component, a second harmonic occurs. A second order susceptibility $\chi(2)$ is expressed by $$\chi_{yyy}(2)=\alpha MxPz$$

That is, the existence of Pz produces $\chi_{yyy}(2)$. This indicates that the material having polarization can enhance the above-described effect. The rotation angle of polarization plane is in proportion to the magnitude of a generated magnetization. Within a weak magnetic field, the magnitude of magnetization is substantially in proportion to an external magnetic field, and therefore, it depends on the magnetic field strength in which the magnetization of a memory occurs.

Therefore, the larger the obtained rotation angle of a polarization plane, the smaller the detectable lower limit of magnetic field strength can be made. With the perpendicular magnetization as shown in FIG. 2, the direction of spin reverses between recording data 0 and 1. In other words, the angle of polarization plane rotates in the positive and negative directions. This also allows a signal indicating the direction of magnetization to be easily read. The leakage magnetic field from a magnetic domain of an actual magnetic memory is several oersteds. Very large rotations of polarization planes shown in embodiments allow this minute leakage magnetic field to be sufficiently detectable.

FIRST EMBODIMENT

An concrete example having a superlattice structure and used as a magnetic sensor element is shown below.

Figure 3:
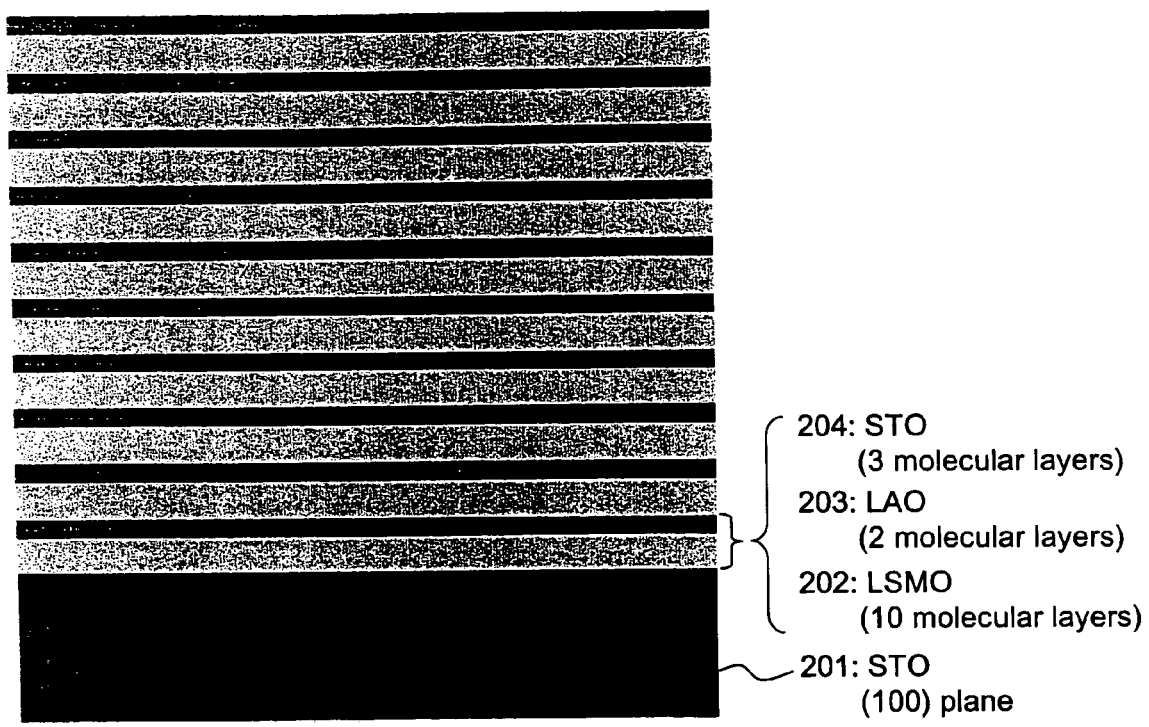
FIG. 3 is a sectional view showing the structure of a superlattice LSMO magnetic sensor element according to the present invention.

FIG. 3 is a sectional view showing the structure of an LSMO magnetic sensor element with a superlattice structure according to the present invention.

This superlattice employed the (100) plane of $SrTiO_3$ (abbreviated as STO) 201 as a substrate. On this substrate (100) plane, ten molecular layers of $La_{0.6}Sr_{0.4}MnO_3$ (abbreviated as LSMO) 202 were stacked. On these LSMO layers, two molecular layers of $LaAlO_3$ (abbreviated as LAO) 203 and three molecular layers of STO 204 were stacked. The film thickness in a single layer is 3.824 Å for LSMO 202, 3.750 Å for LAO 203, and 3.905 Å for STO 204. With the structure constituted of these molecular layers of LSMO 202, LAO 203, and STO 204 were treated as one unit, ten units thereof were stacked on the above-described structure. The film thickness of the one unit is 57.45 Å, that of the ten units being 574.55 Å. The stacking of these molecular layers were performed using a laser abrasion method. The number of stacked layers was determined by an observation using a reflection high-energy electron diffraction (RHEED) method. The purpose of using STO 201 as the substrate is to reduce misfit in lattice constants between the substrate and the films stacked thereon. Here, LSMO 202 is a ferromagnetic film and has an easy magnetization axis within the surface thereof.

Figure 4:
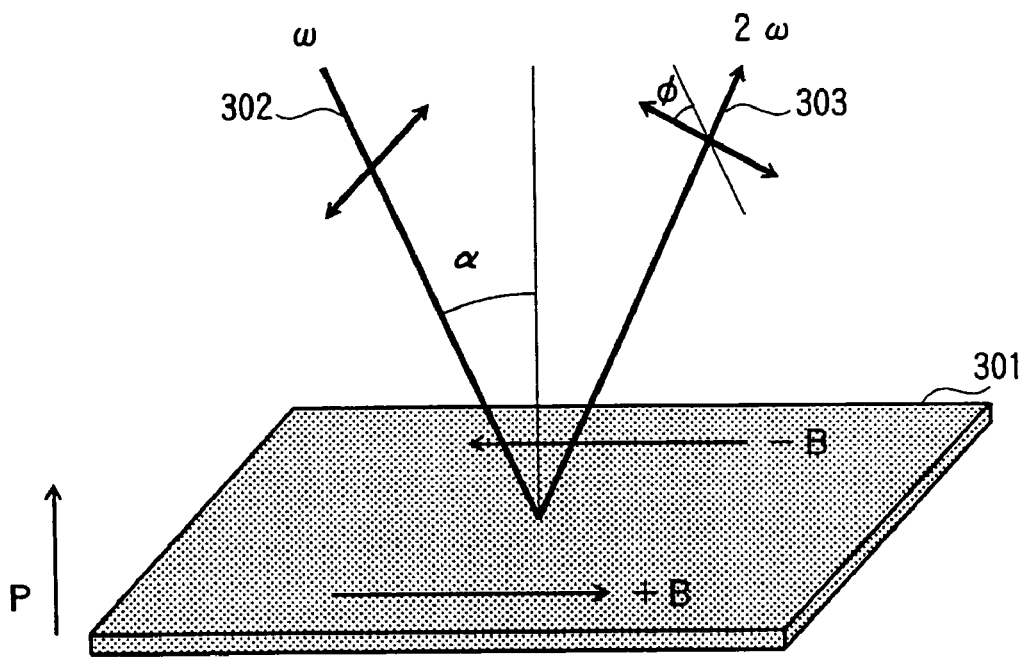
FIG. 4 is a diagram showing the disposition relationship between the superlattice LSMO magnetic sensor element according to the present invention and laser light.

FIG. 4 is a diagram showing the disposition relationship between the superlattice LSMO magnetic sensor element according to the present invention and laser light.

In FIG. 4, reference numeral 301 denotes a magnetic film disposed so that the upper interface structure and lower interface structure of LSMO are different from each other, that is, a magnetic sensor element with a superlattice structure. Reference numeral 302 denotes incident laser light with a frequency ω, and numeral 303 denotes a second harmonic with a frequency 2ω.

As the incident laser light 302, an S-wave polarized light is used that has an electric field vector existing within the surface of the magnetic sensor element. Here, the incident angle is assumed to be α. The second harmonic 303 then generated becomes p-polarized light when an asymmetry of interface exists. The superlattice-structured magnetic sensor element shown in FIG. 3 has an asymmetric structure. Specifically, with one kind of magnetic film group LSMO 202 noted, a film group thereabove is LAO 203, and film group therebelow is STO 204. In this case, the upper interface structure and lower interface structure of LSMO 202 are arranged to differ from each other.

In the event that the film group above LSMO is STO 204 on the contrary, the second harmonic 303 generating from the upper interface and that generating from the lower interface would have mutually opposite phases and cancel each other out, so that the second harmonic 303 would not occur. That is, in an interface where symmetry is retained, no second harmonic occur. Since the structure shown in this embodiment has an asymmetry, it generates the second harmonic 303 of p-polarized light.

Furthermore, when magnetization occurs in LSMO 202, the generated second harmonic 303 becomes s-polarized light. As a result, in the structure comprising the superlattice material in the illustrated embodiment, the polarization plane of the second harmonic 303 provides a composite wave of a p-wave due to the asymmetry and an s-wave due to the magnetization. The purpose of stacking ten of basic units is to enhance the intensity signal of the second harmonic 303. It is supposed that, if the units of the stacked films is transparent with respect to the energy of the incident light 302, the signal intensity of the second harmonic 303 will also be high. In this embodiment, as an incident energy, 1.55 eV was selected. Because the s polarization intensity of the second harmonic 303 is in proportion to the intensity of magnetization, the rotational angle of polarized light depends on the intensity of magnetization.

Figure 5:
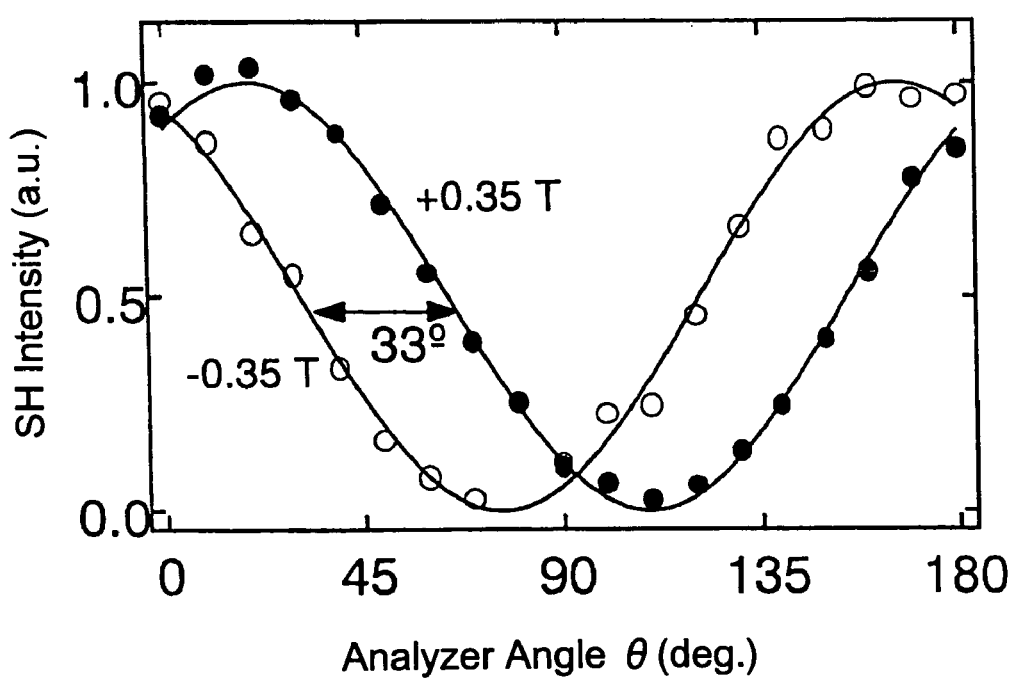
FIG. 5 is a graph showing rotational characteristics of the polarization plane of a second harmonic on the superlattice LSMO magnetic sensor element according to the present invention.

FIG. 5 is a graph showing rotational characteristics of the polarization plane of a second harmonic on the superlattice LSMO magnetic sensor element. Here, symbols ● and ○, respectively, indicate cases of +0.35 T and −0.35 T.

In our experiments, magnetization was generated by applying an external magnetic field of 0.35 Tesla (0.35 T) along each of positive and negative directions, and polarization angles of the second harmonic ware measured.

Figure 1:
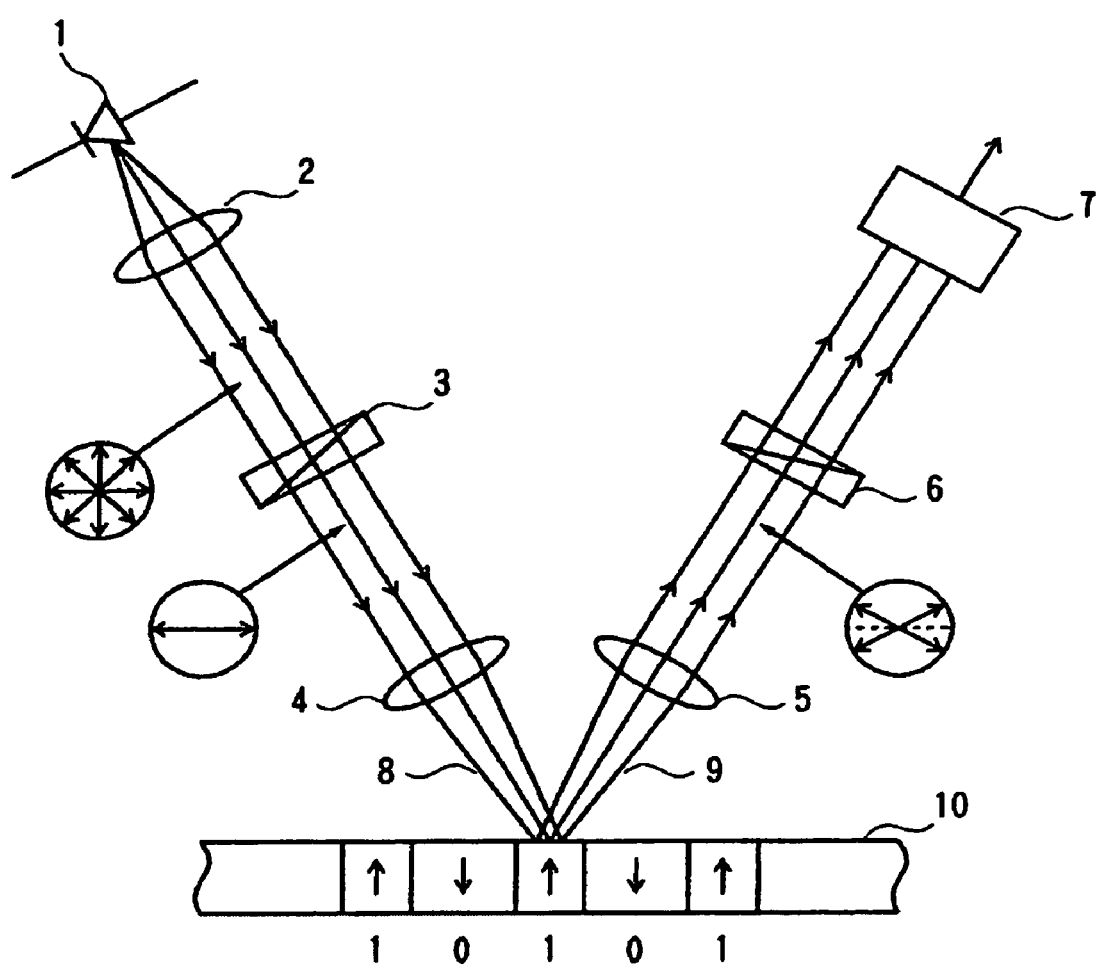
FIG. 1 is a diagram explaining the reproduction principle of a conventional magneto-optical disk.

FIG. 5 shows measured examples of polarization angles and second harmonic generation (SHG) intensities under the conditions that an incident energy=1.55 eV, incident angle=13°, sample temperature=10K. When (a) B=+0.35 T and (b) B=−0.35 T, the polarization-angle relative rotational angle 2ϕ between the cases (a) and (b) exhibited 33°, which is a large relative rotational angle as might be expected. For a magnetic sensor element, it is essential only that an analyzer be provided on the side of output light of SHG and that the intensity of light exiting this analyzer be detected. This is the same thing as reading out stored "up spin" and "down spin" along the magnetization axis by the magneto-optical Kerr rotation shown in FIG. 1.

Figure 6:
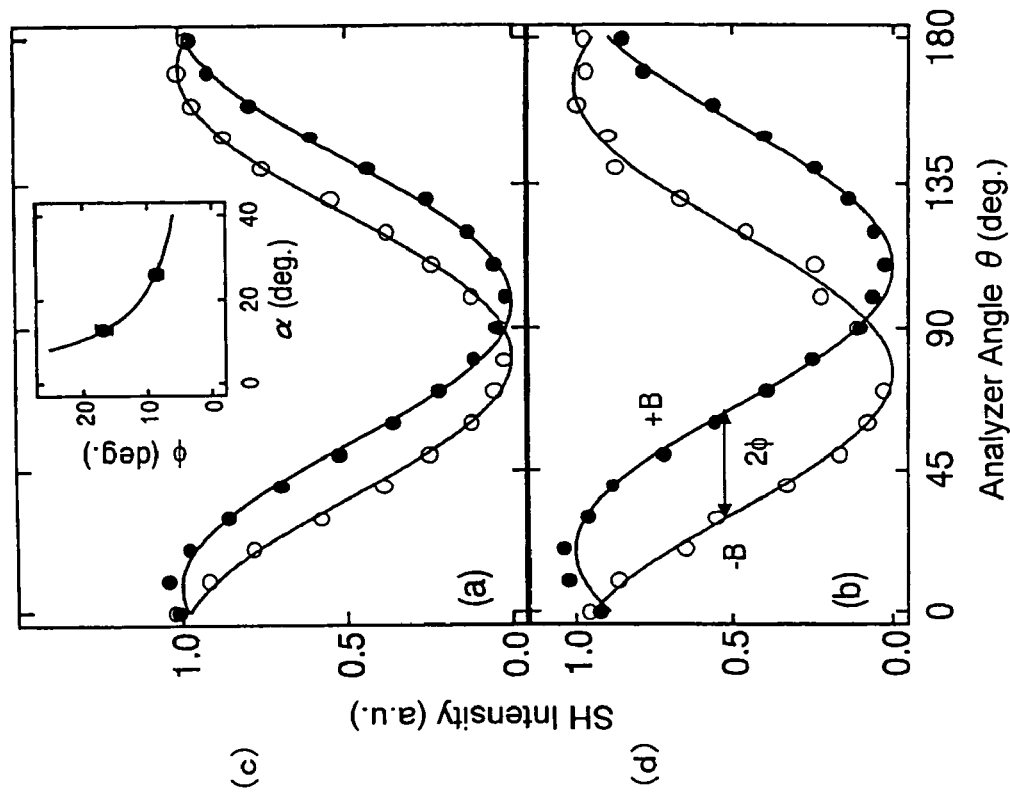
FIGS. 6(a) to 6(d) are diagrams showing the incident angle dependence of the polarization plane of a second harmonic on the superlattice LSMO magnetic sensor element according to the present invention.
Figure 6:
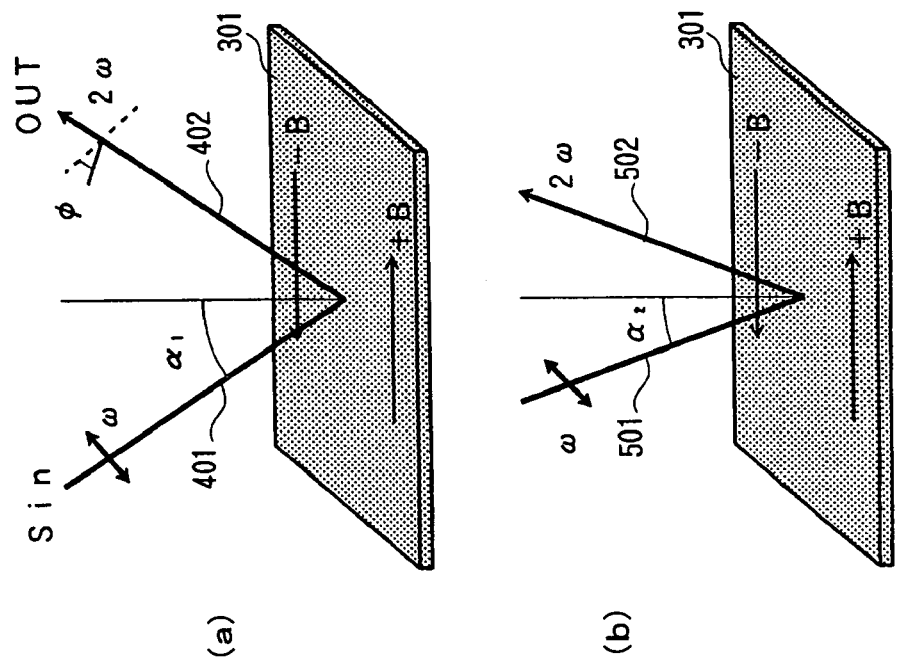

In actuality, the analyzer has a polarization plane inclined at a degree of 45°, and therefore, as shown in each of FIGS. 6(c) and 6(d), the difference in signal intensity at 45° is to be read, that is, the SHG intensity difference between +B(45°) and −B(45°) is to be read. This SHG intensity difference exhibits a signal intensity variation of approximately 50% with respect to the maximum value of SHG signal intensity. Therefore, the rotation of polarization angle of 33° generates as a memory reproduction signal that is a very large signal variation, thus providing a very large reproduction signal.

FIGS. 6(a) to 6(d) are diagrams showing the incident angle dependence of the polarization plane of a second harmonic on the superlattice LSMO magnetic sensor element according to the present invention. FIG. 6(a) shows the polarization plane of a second harmonic when an incident angle $\alpha_1$ of laser light with a frequency ω is 26°, and FIG. 6(b) shows the polarization plane of a second harmonic when an incident angle $\alpha_2$ of laser light with a frequency ω is 13°. FIG. 6(c) is a characteristic view showing the relationship between the rotation angle ϕ of polarization plane and the SH intensity corresponding to FIG. 6(a), and FIG. 6(d) is a characteristic view showing the relationship between the rotation angle ϕ of polarization plane and the SH intensity corresponding to FIG. 6(b). In FIG. 6(a), laser light 401 with a frequency ω is made incident, and a second harmonic 402 with a frequency 2ω is obtained. On the other hand, in FIG. 6(b), laser light 501 with a frequency ω is made incident, and a second harmonic 502 with a frequency 2ω is obtained.

The rotation angle ϕ of polarization plane depends on the incident angle α (see the inset in FIG. 6(c)). The smaller the incident angle α, the larger the rotation ϕ of polarization plane. Therefore, a smaller incident angle α is advantageous, but it involves devising an optical layout. Unlike the case of common magnetization detection by a Kerr rotation (Kerr effect), the energy of exiting light is twice as high as that of incident light, and therefore, use of an appropriate optical filter allows the separation of the exiting light from the incident light.

The temperature dependence of the rotation of polarizing plane with the incident angle $\alpha_1$ being 26°, reflects the temperature dependence of the magnetization of LSMO. The rotation angle ϕ increases with an increase in magnetization.

Figure 7:
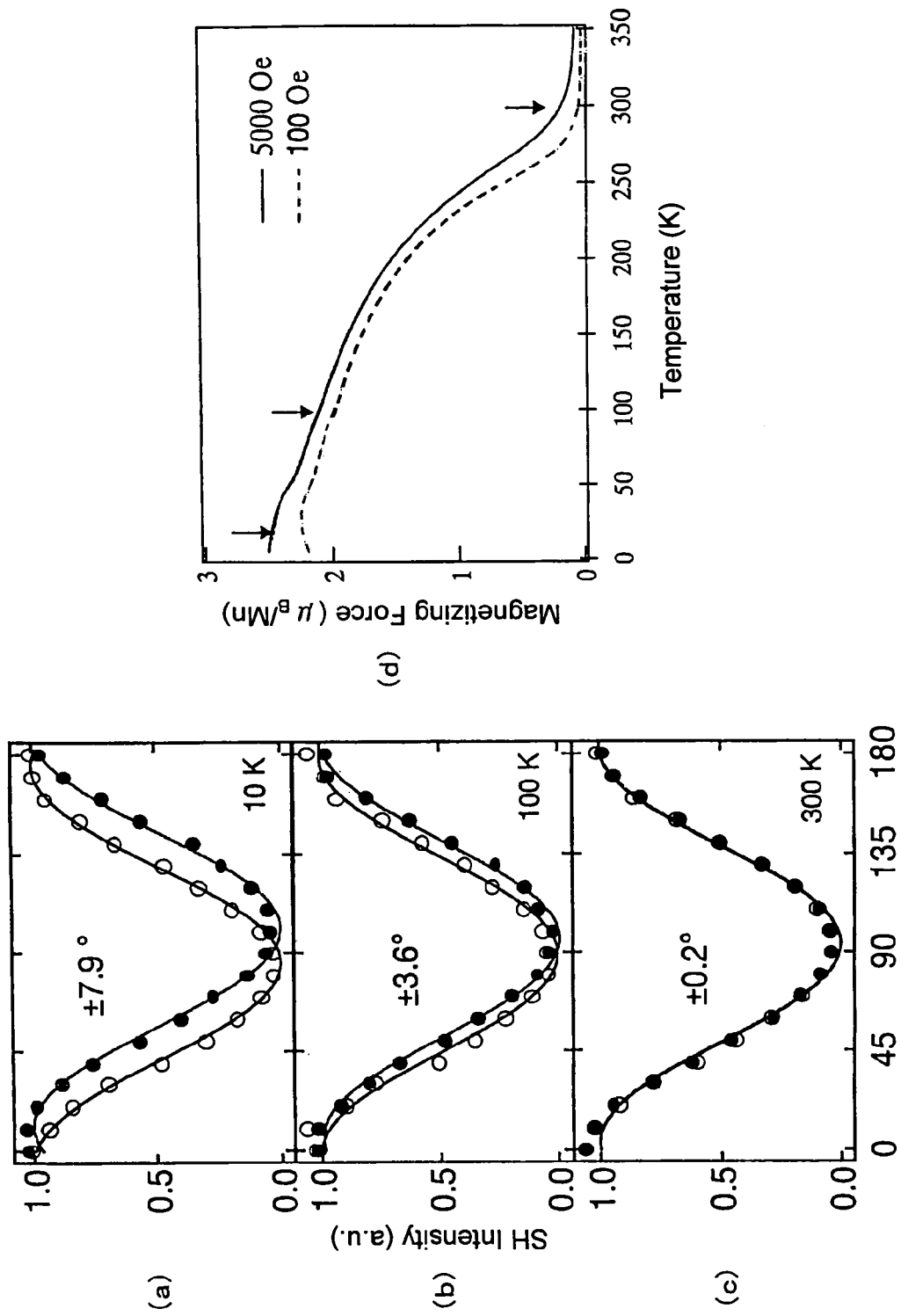
FIGS. 7(a) to 7(d) are diagrams showing the temperature and magnetization dependence of the polarization plane of a second harmonic on the superlattice LSMO magnetic sensor element according to the present invention.

FIGS. 7(a) to 7(d) illustrate the temperature and magnetization dependence of the polarization plane of second harmonic on the superlattice LSMO magnetic sensor element according to the present invention. FIG. 7(a) shows the case where temperature is 10K, with the difference in rotation angle between the cases of +0.35 T (●) and −0.35 T (○) being ±7.9°. FIG. 7(b) shows the case where temperature is 100K, with the difference in rotation angle between the cases of +0.35 T (●) and −0.35 T (○) being ±3.6°. FIG. 7(c) shows the case where temperature is 300K, with the difference in rotation angle between the cases of +0.35 T (●) and −0.35 T (○) being ±0.2°. FIG. 7(d) is a characteristic view showing the relationship between the magnetization ($\mu_B$/Mn) and the temperature (K). It can be seen that the rotation angle ϕ of the polarization plane of second harmonic increases with an increase in magnetization.

According to the obtained results for the superlattice LSMO, with an incident angle α being 13°, the polarization plane of second harmonic rotated by 33° in the positive and negative directions of a magnetic field. In the present embodiment, this rotation angle was obtained under 0.35 T=3500 Oe. In this way, relatively strong external magnetic field was used due to limitations on an experimental apparatus, but it can be seen from the magnetization data shown in FIG. 7(d) that this superlattice material exhibits the same magnetization intensity in an external magnetic field as in the case of 100 Oe. In other words, even in the external magnetic field of 100 Oe, a rotation angle on the order of 33° can be obtained. Current magnetic optical systems for reading Kerr rotation industrially have a sufficient accuracy to read a rotation on the order of 0.1°. If a leakage magnetic field from the perpendicular magnetization film is 1 Oe, the rotation angle of the polarization plane of second harmonic will be on the order of 0.3°. This indicates that current magnetic optical systems have an industrially sufficient identification accuracy.

The film thickness of this superlattice is 575 Å as shown in FIG. 3, and therefore, as the minimum detectable magnetization size, the size on the order of 575 Å is feasible. In actuality, because signal processing techniques are advanced, the size on the order of 300 Å, which is about a half of 575 Å, is also feasible. Thus, even a magnetization size of a few hundred angstroms can be detected. The detection capability with respect to a minute size can be further improved by reducing the number of the above-described units. Since, in principle, even a single layer can be detected, it might be possible to detect even the film thickness 3.82 Å of a single layer of LSMO. Thus, the detection capability with respect to a minute size on just the angstrom order might be secured.

The temperature shown in this embodiment is 10 K, but the magnetic sensor using a second harmonic is sufficiently operable even at room temperature, by using a superlattice structure that employs a material having a sufficiently high ferromagnetic transition temperature, as a magnetic material.

SECOND EMBODIMENT

A concrete example is shown in which a rhombic crystal $GaFeO_3$ is incorporated in a magnetic sensor.

This crystal has a rhombic crystal structure, and it has a space group of $Pc2_{1n}$ according to the classification table of space groups. This crystal has a structure such that the easy magnetization axis thereof constitutes a c-axis, and the polarization axis thereof constitutes a b-axis. The dispositions of this crystal structure, the polarization direction of incident light, and an SHG signal are shown in FIG. 8.

Figure 8:
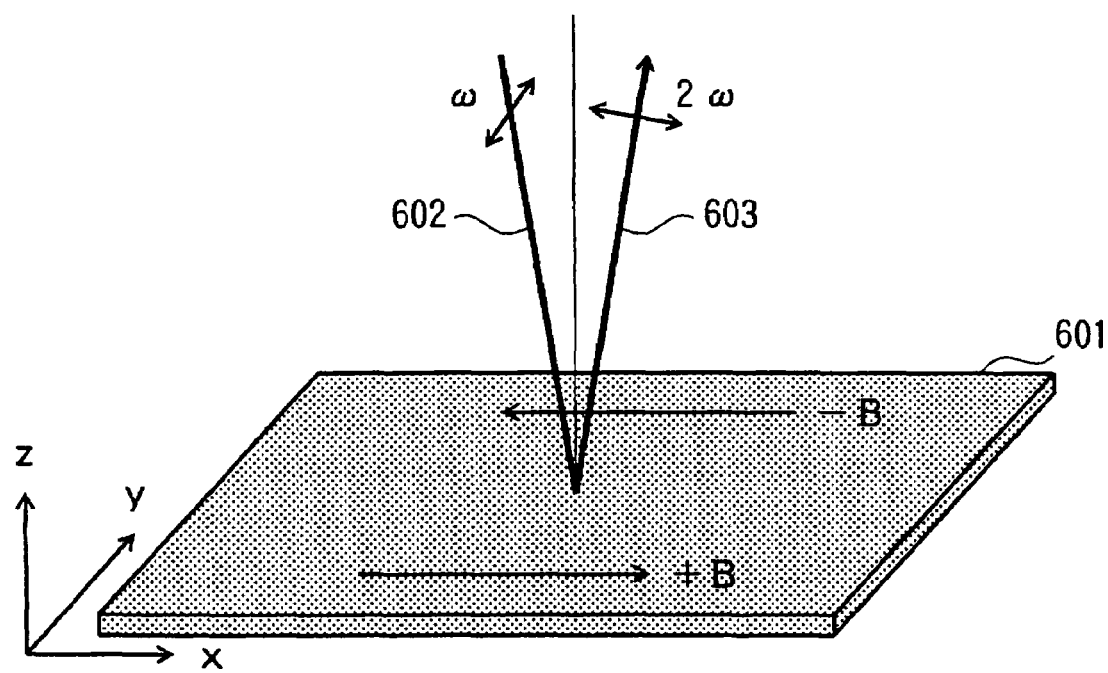
FIG. 8 is a diagram showing the disposition relationship between the crystal structure of a $GaFeO_3$ magnetic sensor element according to the present invention and laser light.

FIG. 8 is a diagram showing the disposition relationship between the crystal structure of the $GaFeO_3$ magnetic sensor element according to the present invention and laser light. Here, the polarization axis, i.e., b-axis, of $GaFeO_3$ is arranged to be a z-axis, and the easy magnetization axis thereof is arranged to be an x-axis. Laser light is made incident parallel to the b-axis, i.e., along the z-axis direction.

In FIG. 8, reference numeral 601 denotes a magnetic sensor element comprising a $GaFeO_3$ rhombic crystal, numeral 602 denotes laser light with a frequency ω, and numeral 603 denotes a second harmonic with a frequency 2ω.

Figure 9:
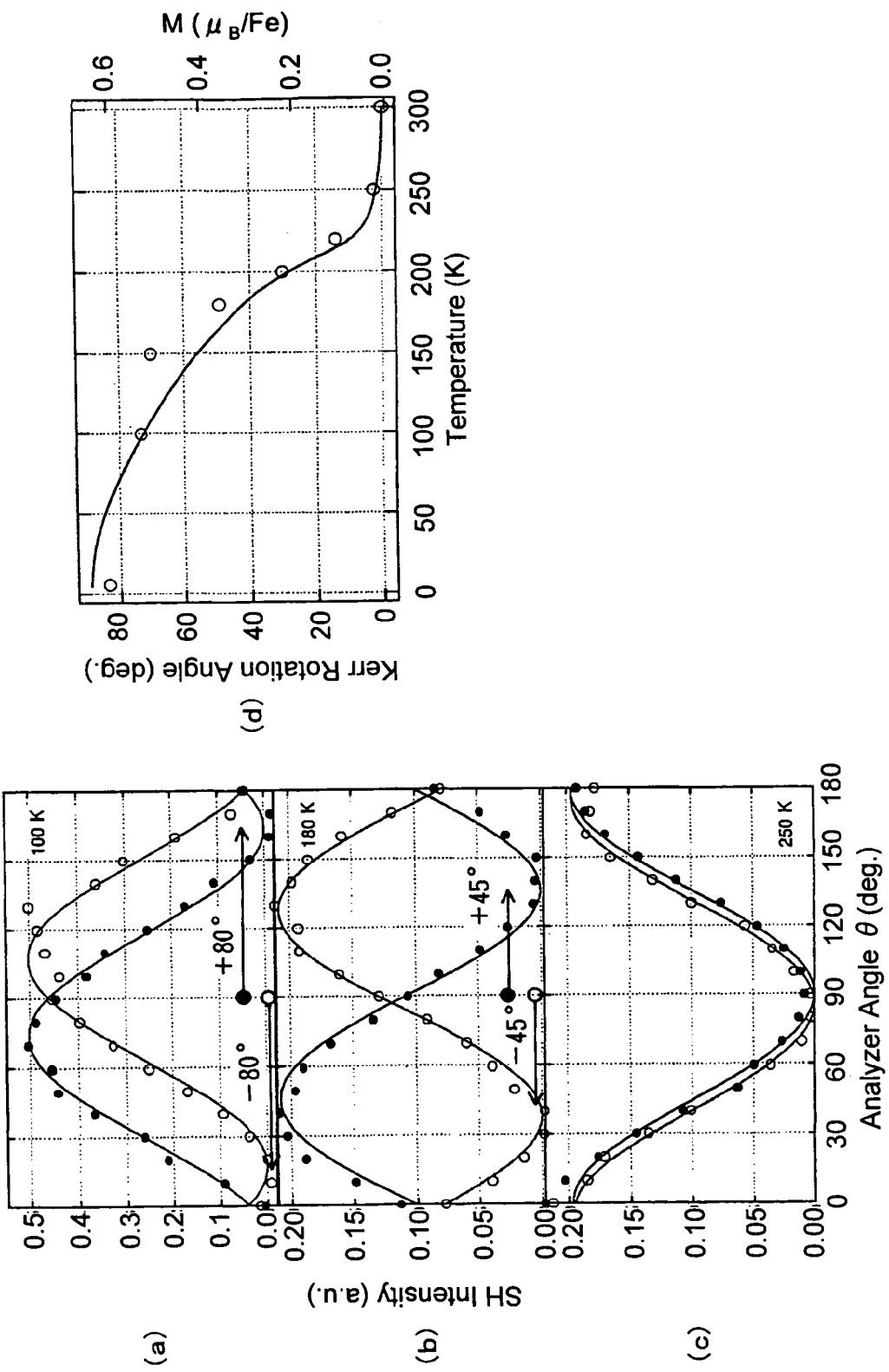
FIGS. 9(a) to 9(d) are diagrams showing the temperature and magnetization dependence of the polarization plane of a second harmonic on the $GaFeO_3$ magnetic sensor element according to the present invention.

$GaFeO_3$ has a ferrimagnetic property, and its transition temperature is 210 K. The temperature dependence of the magnetization M of $GaFeO_3$ is shown with a solid line in FIG. 9(d).

FIGS. 9(a) to 9(c) show measurement results regarding SHG intensities on the $GaFeO_3$ magnetic sensor element and the polarization plane under the conditions: an incident energy=1.55 eV, an s-polarized incident light angle=26°, with temperature being 250 K (FIG. 9(c)), which is above the ferrimagnetic transition temperature Tc (210 K), 180 K (FIG. 9(b)), which is directly below Tc, and 100 k (FIG. 9(a)), which is sufficiently lower than Tc.

Here, the magnetic field is applied in parallel with the c-axis, and the magnetic field strength is set to B=+0.35 T and B=−0.35 T because of restrictions on the experimental arrangement.

The rotation angles φ of polarization plane were φ=0 at 250 K, φ=±45° at 180 K, and φ=±80° at 100 K. Thus, the rotation angles φ exhibited gigantic values. The relationship between the rotation angle and the temperature is shown using a symbol ○ in FIG. 9 (d). As can be seen from FIG. 9(d), this temperature dependence of the rotation angle conforms to the tendency of the magnetization curve of $GaFeO_3$. In other words, regarding the temperature dependence, the rotation angle of polarization is in conformance with the magnetic susceptibility of this magnetic sensor. The polarization rotating angles of SHG at 100 K were ±80° (±0.35 T), that is, a polarization angle relative rotation angle 2φ=160°, which is a gigantic polarization rotation angle, was obtained. As shown in the first embodiment, in actuality, with a polarizer provided at an angle of 45° on the SHG signal side, the direction of magnetic field is to be read, and therefore the polarization rotation angle is too large at 100 K. With a temperature on the order of 180 K provided, the output intensity of the polarizer could vary up to the maximum intensity 100% of SHG. The actual polarization rotation angle depends on the magnetic field strength generated by the magnetization of a memory, and the rotation angle becomes smaller. Therefore, the higher the capability of rotating responsively to the magnetic field, the better.

The $GaFeO_3$ crystal is produced by a floating zone melting method (Japanese Patent Application No. 2002-234708). Specifically, a single crystal $Ga_{2-x}Fe_xO_3$ having a rhombic crystal structure is produced by a floating zone melting method in which the front ends of sample bars formed of $Ga_{2-x}Fe_xO_3$ and disposed on the upper and lower sides, is heated using a heat source placed at a co-focus position in a gas atmosphere, and in which a floating zone is formed between the front ends of the above described sample bars formed of $Ga_{2-x}Fe_xO_3$.

$Ga_{2-x}Fe_xO_3$ has a Tc of 210 K when x=1. When x=1.4, $Ga_{2-x}Fe_xO_3$ has a Tc of 360 K and hence it has the above-described effect at room temperature. With x=1.4, therefore, $Ga_{2-x}Fe_xO_3$ can be put to service as a magnetic sensor element to be used at room temperature.

The magnetic sensor element according to this embodiment is formed of a single crystal flake. Currently, one means for taking out a single crystal flake is a field ion beam (FIB) apparatus. Use of this apparatus makes it possible to take out a crystal flake of 100 μm square and having a film thickness on the order of several hundred Angstroms and to set the crystal flake in a state of being oriented. As a consequence, the detection with respect to a minute magnetization size on the order of several hundred Angstroms becomes feasible.

The present invention is not limited to the above-described embodiments, but it is to be understood that various modifications and variations may be made within the true spirit of the present invention, and that these modifications and variations are not excluded from the scope of the present invention.

As described above in detail, according to the present invention, it is possible to provide a magnetic sensor element capable of detecting a minute magnetic domain structure in a several hundred Angstrom region by means of a system different from the conventional ones. This element is capable of detecting a minute magnetic domain structure even in several ten Angstrom region, which leads to the solution of a large problem associated with data reproduction devices in magnetic recording apparatuses. This allows an enormous magnetic memory device in terabit region to be provided, thereby enabling an enormous memory suitable for information communications and an optical computer to be provided.

Also, this sensor element is not limited to application to a reproduction device for a magnetic memory. For example, when supplied with a current, a coil generates a magnetic field. By using this principle, the polarization plane of second harmonic can be easily controlled. Specifically, by providing a polarizer on the output side, light can be easily turned on/off. This makes it possible to apply this sensor element to a current controlled optical switching element in a light communication network, and to provide this sensor element with a function as a light modulation element.

Furthermore, since the magnetic sensor can sensitively detect a magnetic field in a minute region, for example, by disposing a minute magnet on one side and mounting the magnetic sensor proposed herein on the other side, the present invention can also be applied to an opening/closing sensor (e.g., an opening/closing sensor for a mobile phone).

In this manner, the present invention is not restricted to application to a magnetic memory, but it would also be adaptable for use as a basic element in a wide-ranging information network.

INDUSTRIAL APPLICABILITY

The magnetic sensor according to the present invention has a high sensitivity and high spatial resolution, and hence, it is particularly suitable for a reproduction device for a magnetic memory. Moreover, this magnetic sensor is adaptable for use as a basic device associated with optical communications.

The invention claimed is:

1. A magnetic sensor comprising:
   (a) a magnetic sensor element that is disposed with respect to a body having spin information, that has an interface structure having spatial asymmetry, and in which one solid material constituting the interface is a magnetic material;
   (b) laser beam irradiation means acting on the magnetic sensor element; and
   (c) the magnetic sensor reading out the spin information of the body having the spin information based on a variation of a rotation angle of a polarization plane of a second harmonic with a frequency $2\omega$ exiting the magnetic sensor element, by applying laser light with a frequency $\omega$ to the magnetic sensor element by the laser beam irradiation means.

2. The magnetic sensor according to claim 1, wherein, in order to generate the second harmonic, at least one magnetic material of the magnetic sensor element comprises a structure in which the interface is constituted of a ferromagnetic material including a ferrimagnetic material.

3. The magnetic sensor according to claim 2, wherein, in order to generate the second harmonic, at least one material of the magnetic sensor element is a ferromagnetic including ferrimagnetic thin film material, and wherein the other materials are multilayered thin film materials that constitute interfaces using a plurality of thin film materials.

4. The magnetic sensor according to claim 3, wherein, out of the plurality of thin film materials, at least one is a transition metal film or a transition metal oxide film.

5. The magnetic sensor according to claim 4, wherein, out of the plurality of thin film materials, at least one is a manganese oxide compound film.

6. The magnetic sensor according to claim 5, wherein, out of the plurality of thin film materials, at least one is $(A_{1-x}B_x)$ $MnO_3$ ($0 \leq x \leq 1$), wherein A is an alkaline-earth element or a rare-earth element, and wherein B is an alkaline-earth element or a rare-earth element both exclusive of A, or an oxide.

7. The magnetic sensor according to claim 6, wherein, out of the plurality of kinds of thin film materials, at least one kind of thin film material is $(A_{1-x}B_x)$ $MnO_3$ ($0 \leq x \leq 1$), and wherein, with a film construction comprising the other plural kinds of films treated as one unit, a multilayer film formed by repeating the unit a plurality of times is used as at least one thin film material.

8. The magnetic sensor according to claim 2, wherein a multilayer structure is used that is formed by sandwiching the transition metal oxide thin film of the magnetic sensor element between $SrTiO_3$ thin films above and below.

9. The magnetic sensor according to claim 2, wherein a $SrTiO_3$ crystal is used as a material of a substrate for supporting a plurality of thin film materials of the magnetic sensor element.

10. The magnetic sensor according to claim 1, wherein, in order to generate the second harmonic, at least one thin film or crystal flake of the magnetic sensor element comprises a material having an easy magnetization axis and a polarization axis that are perpendicular to each other.

11. The magnetic sensor according to claim 10, wherein, in order to generate the second harmonic, one thin film material and other plural thin film materials of the magnetic sensor element are used, the one thin film material and the other plural thin film materials each having the easy magnetization axis and the polarization axis that are mutually perpendicular.

12. The magnetic sensor according to claim 11, wherein, in order to generate the second harmonic, light having an electric field component perpendicular to the easy magnetization axis is made incident on a material of the magnetic sensor element, the material having the easy magnetization axis and the polarization axis that are perpendicular to each other, and wherein the second harmonic component of the light is used that reflects with respect to the incident light or that is transmitted.

13. The magnetic sensor according to claim 12, wherein, out of the plurality of thin film materials of the magnetic sensor element, at least one is a transition metal film or a transition metal oxide film.

14. The magnetic sensor according to claim 13, wherein, out of the plurality of thin film materials of the magnetic sensor element, at least one is a manganese oxide compound film.

15. The magnetic sensor according to claim 14, wherein, out of the plurality of thin film materials of the magnetic sensor element, at least one is $(A_{1-x}B_x)$ $MnO_3$ ($0 \leq x \leq 1$), wherein A is an alkaline-earth element or a rare-earth element, and wherein B is an alkaline-earth element or a rare-earth element, both exclusive of A, or an oxide.

16. The magnetic sensor according to claim 15, wherein, out of the plurality of kinds of thin film materials of the magnetic sensor element, at least one kind of film material is $(A_{1-x}B_x)$ $MnO_3$ ($0 \leq x \leq 1$), and wherein, with a film construction comprising the other plural kinds of films treated as one unit, a multilayer film formed by repeating the unit a plurality of times is used as at least one thin film material.

17. The magnetic sensor according to claim 12, wherein an iron oxide and an iron oxide thin film are used as materials of the magnetic sensor element, the materials each having the easy magnetization axis and the polarization axis of the magnetic sensor that are mutually perpendicular.

18. The magnetic sensor according to claim 17, wherein a crystal and a thin film of $Ga_{2-x}Fe_xO_3$ are used, as materials of the magnetic sensor element, the materials each having the easy magnetization axis and the polarization axis that are mutually perpendicular.

19. The magnetic sensor according to claim 18, wherein, a crystal and a thin film of $Ga_{2-x}Fe_xO_3$ is used that has a rhombic crystal structure and in which x defining the composition of iron is in the range of 0.7 to 1.5, both inclusive, as materials of the magnetic sensor element each having the easy magnetization axis and the polarization axis that are mutually perpendicular.

* * * * *